(12) United States Patent
Kohler et al.

(10) Patent No.: US 7,764,541 B2
(45) Date of Patent: Jul. 27, 2010

(54) METHOD AND APPARATUS FOR HOT CARRIER PROGRAMMED ONE TIME PROGRAMMABLE (OTP) MEMORY

(75) Inventors: Ross Alan Kohler, Allentown, PA (US); Richard Joseph McPartland, Nazareth, PA (US); Ranbir Singh, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 144 days.

(21) Appl. No.: 10/586,176

(22) PCT Filed: Jan. 23, 2004

(86) PCT No.: PCT/US2004/001772

§ 371 (c)(1),
(2), (4) Date: Apr. 6, 2007

(87) PCT Pub. No.: WO2005/081258

PCT Pub. Date: Sep. 1, 2005

(65) Prior Publication Data

US 2007/0274126 A1  Nov. 29, 2007

(51) Int. Cl.
G11C 11/34 (2006.01)

(52) U.S. Cl. .............. 365/184; 365/104; 365/186; 365/185.05; 257/E29.255; 257/E21.662; 257/E27.102

(58) Field of Classification Search ............ 365/184, 365/104, 186, 185.05, 185.26, 185.28; 257/314, 257/E29.255, E21.662, E27.102
See application file for complete search history.

(56) References Cited

U.S. PATENT DOCUMENTS 5,257,225 A * 10/1993 Lee .................. 365/185.19
5,751,635 A * 5/1998 Wong et al. ........... 365/185.19
6,018,475 A  1/2000 Papadas et al. ........... 365/174

(Continued)

FOREIGN PATENT DOCUMENTS

EP  0 239 968 A2  3/1987

(Continued)

OTHER PUBLICATIONS

Doyle et al., Characterization of oxide trap and interface trap creation during hot-carrier stressing on n-mos transistors using he floating-gate technique, 1993, IEEE Electron Device Letters, vol. 14, No. 2, Feb. 1993; all pages.*

(Continued)

*Primary Examiner*—Hoai V Ho
*Assistant Examiner*—Fernando N Hidalgo
(74) *Attorney, Agent, or Firm*—Ryan, Mason & Lewis, LLP (57) ABSTRACT

One time programmable memory devices are disclosed that are programmed using hot carrier induced degradation to alter one or more transistors characteristics. A one time programmable memory device is comprised of an array of transistors. Transistors in the array are selectively programmed using hot carrier induced changes in one or more transistor characteristics, such as changes to the saturation current, threshold voltage or both, of the transistors. The changes to the transistor characteristics are achieved in a similar manner to known hot carrier transistor aging principles. The disclosed one time programmable memory devices are small and programmable at low voltages and small current.

19 Claims, 4 Drawing Sheets

U.S. PATENT DOCUMENTS

| | | | |
|---|---|---|---|
| 6,020,227 A * | 2/2000 | Bulucea | 438/194 |
| 6,512,700 B1 | 1/2003 | McPartland et al. | 365/185.28 |
| 6,888,749 B2 * | 5/2005 | Forbes | 365/185.01 |
| 6,909,635 B2 * | 6/2005 | Forbes et al. | 365/185.18 |
| 6,920,067 B2 * | 7/2005 | Hsu et al. | 365/185.26 |
| 2004/0027877 A1 * | 2/2004 | Kotz et al. | 365/200 |
| 2005/0146932 A1 * | 7/2005 | Lee et al. | 365/185.05 |

FOREIGN PATENT DOCUMENTS

| | | |
|---|---|---|
| EP | 1 103 980 A2 | 5/2001 |
| JP | 2000-049242 | 2/2000 |
| WO | WO 2004053886 A1 * | 6/2004 |

OTHER PUBLICATIONS

Vuillaume et al., Charging and discharging properties of electron traps created by hot-carrier injections in gate oxide of n-channel metal oxide semiconductor field effect transistors, Mar. 1993, J. Appl. Physics, vol. 73, No. 5. Whole document pertinent.*

* cited by examiner

METHOD AND APPARATUS FOR HOT CARRIER PROGRAMMED ONE TIME PROGRAMMABLE (OTP) MEMORY

FIELD OF THE INVENTION

The present invention relates generally to integrated circuits including electronic memory devices, and more particularly to one time programmable (OTP) memories.

BACKGROUND OF THE INVENTION

One time programmable (OTP) memories are often used to store program code and other information. Among other benefits, the one-time nature of OTP memories prevent authorized program code from being modified or over-written with unauthorized program code. OTP memories may be implemented, for example, using are fusible links, antifuse or floating gate non-volatile memory technologies. Fusible links are metal or polysilicon wires that are "blown," i.e., made to have higher resistance, by passing a high current through them. As a result, fusible links exhibit some amount of physical destruction of the metal or polysilicon wire. Fusible links are relatively large and require relatively high current to program. Antifuse is the partial physical destruction or degradation of a Metal Oxide Semiconductor (MOS) capacitor gate oxide dielectric by the application of a high voltage. A lower resistance conduction path is formed between the plates of the capacitor through the oxide dielectric. Antifuse technologies require relatively high voltage to program and do not scale well with Complementary Metal Oxide Semiconductor (CMOS) technologies. The thinner MOS gate oxides associated with current CMOS technologies do not program consistently in a reliable manor.

Floating gate non-volatile memory involves the injection of electrical charge onto the isolated or unconnected (floating) gate of a field-effect-transistor (FET). The accumulation of charge on the gate changes the threshold voltage of the transistor, which can be sensed during a read operation. Floating gate non-volatile memories are employed for "flash" non-volatile memories. Floating gate non-volatile memories require relatively high voltage and sometimes relatively high current to program. Furthermore, floating gate non-volatile memories usually require additional special CMOS processing, thereby increasing fabrication cost.

A need therefore exists for improved OTP memories that are small in size and can be programmed with low voltages and small current.

SUMMARY OF THE INVENTION

Generally, one time programmable memory devices are disclosed that are programmed using hot carrier induced degradation to alter one or more transistors characteristics. A one time programmable memory device is comprised of an array of transistors. Transistors in the array are selectively programmed using hot carrier induced changes in one or more transistor characteristics, such as changes to the saturation current, threshold voltage or both, of the transistors. The changes to the transistor characteristics are achieved in a similar manner to known hot carrier transistor aging principles. The present invention recognizes that such characteristic changes can be selectively applied to memory cells in OTP memory devices in order to program the OTP memory device in a desired manner.

The present invention provides for small, low cost, OTP memories that are programmable at low voltages and small current. The OTP memories of the present invention can be fabricated with normal CMOS processing techniques with little, if any, additional processing steps and with minimal, if any, increased fabrication costs. The OTP memories of the present invention are scalable with future CMOS technologies.

A more complete understanding of the present invention, as well as further features and advantages of the present invention, will be obtained by reference to the following detailed description and drawings.

DETAILED DESCRIPTION

Figure 1:
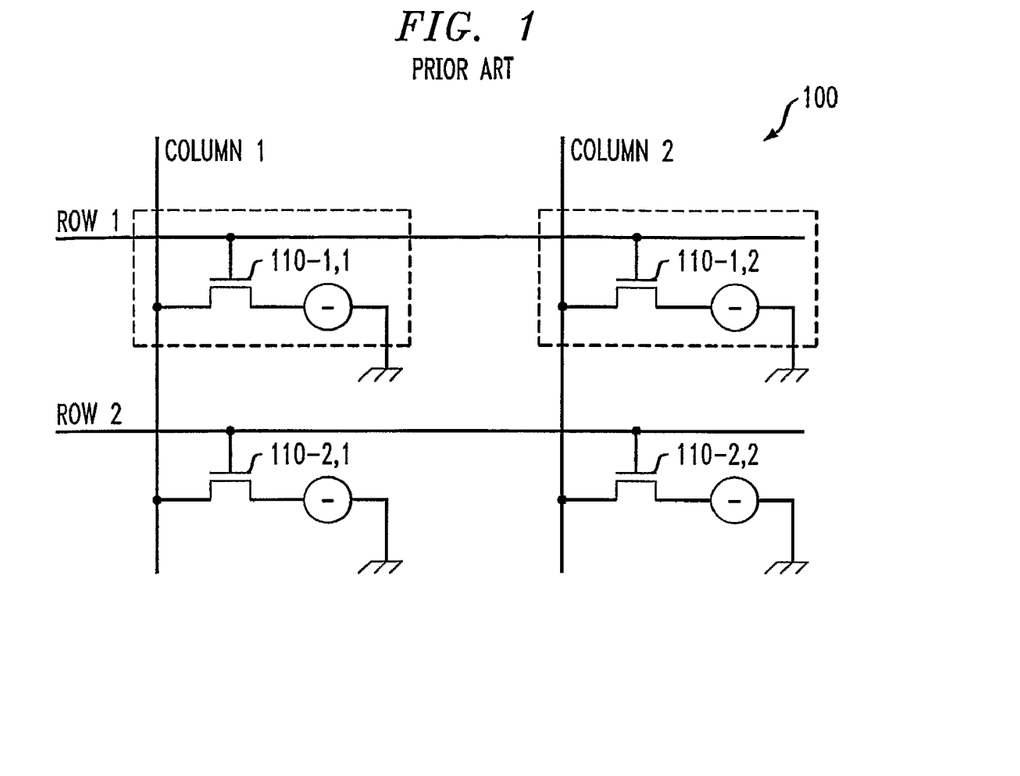
FIG. 1 illustrates a conventional fusaible link or antifuse OTP memory array.

FIG. 1 illustrates a conventional two by two fusible link or antifuse OTP memory array 100 of memory cells 110-1,1 through 110-i, j. The memory cells 110-1,1 through 110-i, j are generally comprised of FET transistors in series with the fusible element generally arranged in a grid pattern having a plurality (or series) of rows and columns. As shown in FIG. 1, the exemplary OTP array 100 includes a plurality, i, of rows (i=2), and a plurality, j, of columns (j=2). Each column is supplied with power at a first predetermined voltage level, often referred to as the "pre-charged voltage level," and each row is supplied with power at a second predetermined voltage level. Values for these first and second predetermined voltage levels typically depend upon the selected implementation.

As shown in FIG. 1, a gate of each transistor 110 of the OTP array 100 is connected to a particular row of the series of rows. A source of each transistor is generally programmably connected to ground through the fuse element and a drain of each transistor is connected to a particular column of the series of columns. The fusible element can be a fusible link or an antifuse. A fusible link is programmed by passing current through the link of sufficient magnitude and duration to change the electrical properties of the link from low to high resistance. An antifuse is programmed by applying a voltage across the antifuse of sufficient magnitude to change its electrical characteristics from high to low resistance. The programming current or voltage for the fusible link or antifuse may be routed through the illustrated cell transistor or through additional transistors not shown.

Figure 2:
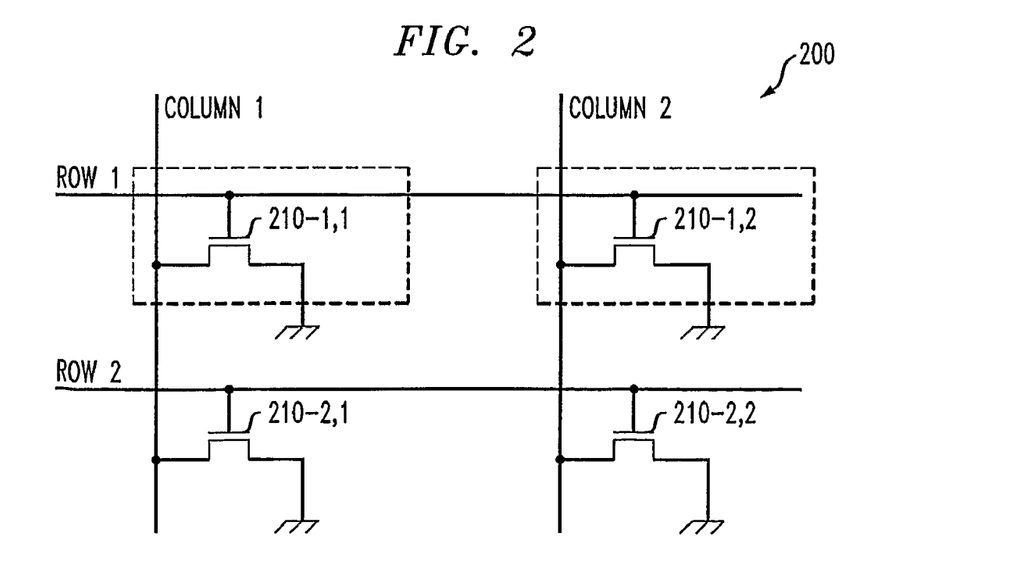
FIG. 2 illustrates an OTP memory array incorporating features of the present invention.
Figure 3:
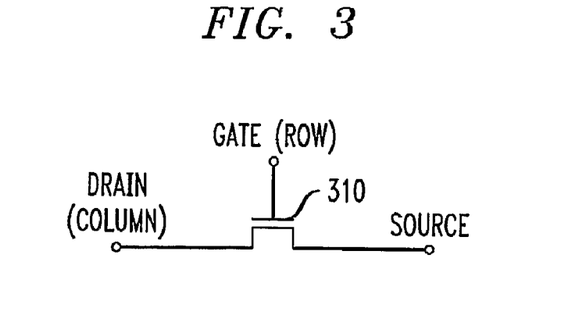
FIG. 3 is a schematic diagram illustrating the various terminals of each memory cell of FIG. 2.

FIG. 2 illustrates a two by two OTP memory array 200 of memory cells 210-1,1 through 210-i, j that may, for example, comprise a portion of an integrated circuit. The memory cells 210-1,1 through 210-i, j are generally comprised of FET transistors generally arranged in a grid pattern having a plurality (or series) of rows and columns. FIG. 3 is a schematic diagram illustrating the various terminals of the FET transistor within each memory cell 210 of FIG. 2. As shown in FIG. 2, the exemplary OTP array 200 includes a plurality, i, of rows (i=2), and a plurality, j, of columns (j=2). Each column is supplied with power at a first predetermined voltage level, often referred to as the "pre-charged voltage level," and each row is supplied with power at a second predetermined voltage level. Values for these first and second predetermined voltage levels typically depend upon the selected implementation.

As shown in FIG. 2, a gate of each transistor 210 of the OTP array 200 is connected to a particular row of the series of rows. A source of each transistor is generally connected to ground and a drain of each transistor is connected to a particular column of the series of columns. According to the present invention, the OTP array 200 is programmed using hot carrier induced changes in transistor characteristics (saturation current, threshold or both).

Hot Carrier Aging

Hot carrier aging is the degradation of transistor characteristics over time caused by the injection of carriers into the gate oxide at the drain end of the device. Carrier injection into the oxide causes oxide damage and creation or filling of traps near the drain. As a result, the channel mobility degrades, causing a decrease in device saturation current. In addition, a localized increase occurs in the device threshold at the drain end of the channel region. Hot carrier transistor degradation can be accelerated so that it occurs in a relatively short time by device optimization or the application of modestly higher drain and gate voltages (or both).

The present invention recognizes that the above-mentioned degradation of transistor characteristics can be used to advantage to program OTP memories. The FET transistors 210 of FIG. 2 can be selectively "programmed" by the application of "stressful" voltage levels to appropriate terminals of the FET transistor in order to introduce hot carrier transistor degradation. These stressful voltage levels could be normal logic voltage levels ($V_{DD}$) or marginally higher voltage levels. The stressful voltage levels required by the present invention are not as high as those required by other proposed OTP memories and are easily provided using normal logic or input/output transistors and usual circuit design techniques.

After selectively programming transistors 210 in the OTP memory array 200, the programmed transistors 210 will have significantly lower saturation current, or lower threshold voltages at the end of the channel close to where the stress voltage was applied during programming, or both. Thus, programmed cells can be detected during a read operation by either sensing the lower saturation current or by sensing the lower threshold voltage.

Figure 4:
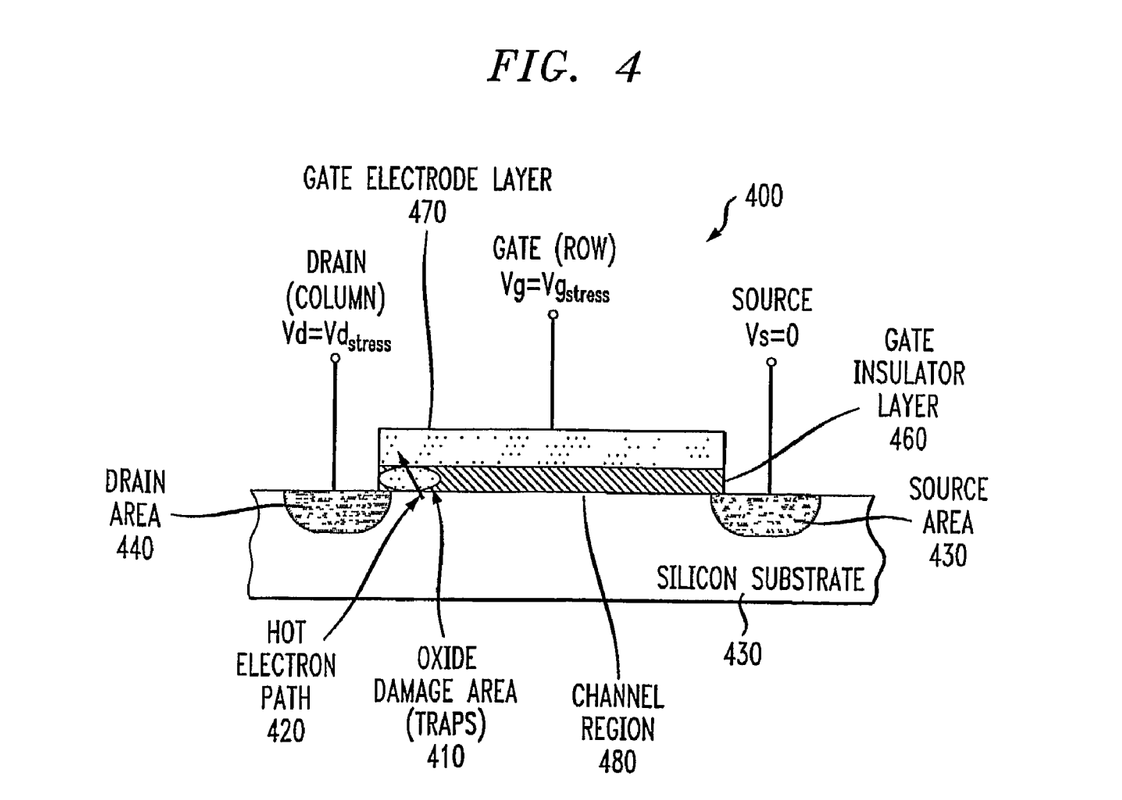
FIG. 4 is a cross-sectional view of a typical MOS FET transistor.

FIG. 4 is a cross-sectional view of a typical MOS FET transistor 400 similar to that used for an OTP memory cell. The basic construction and function of the MOS FET transistor 400 is well known. The MOS FET transistor 400 is formed on a silicon substrate 430. Source 450 and drain 440 are formed by relatively heavy implants of impurities. A gate insulator 460, typically silicon dioxide, is formed over the channel region 480. A gate electrode 470, typically polysilicon, is formed over the gate insulator.

As is well known, there are two general types of MOS FET transistors, n-channel and p-channel types. N-channel transistors are used herein for the purpose of illustration of the present invention. It is recognized that p-channel transistors could also be used for the present invention. As is well known, an n-channel transistor is constructed on a p type substrate, or alternately a p-well, and has n-type impurity implants for source 450 and drain 440.

Figure 5A:
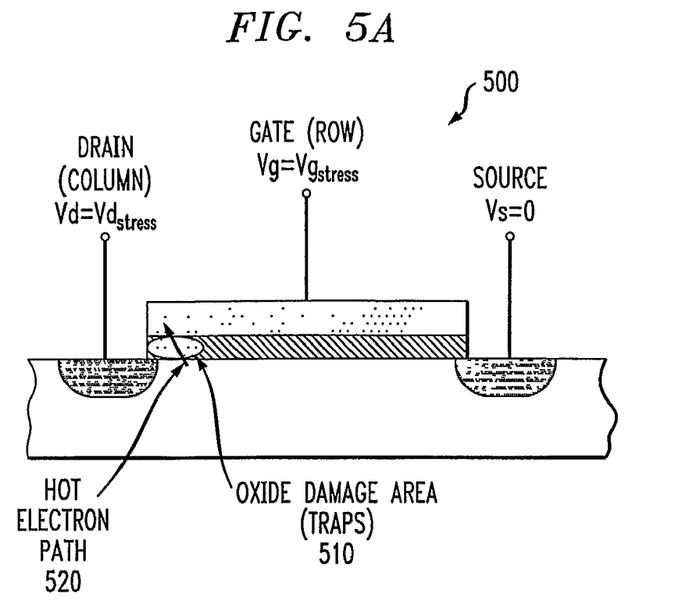
FIGS. 5A and 5B are schematic diagrams illustrating the programming and reading, respectively, of a first embodiment of an OTP memory cell incorporating features of the present invention.

FIG. 5A is a schematic diagram illustrating the programming of a first embodiment of an OTP memory cell 500 incorporating features of the present invention. The OTP memory cell 500 may be embodied, for example, as a MOS FET transistor. As shown in FIG. 5A, an OTP memory cell 500 is programmed using hot carrier induced changes to the threshold voltage by applying "stressful" voltage levels to the drain ($Vd_{stress}$) and gate ($Vg_{stress}$). The hot carrier degradation of the transistor characteristics creates an oxide damage area 510 (traps) near the drain that causes a localized increase in the device threshold at the drain end of the channel region.

Figure 5B:
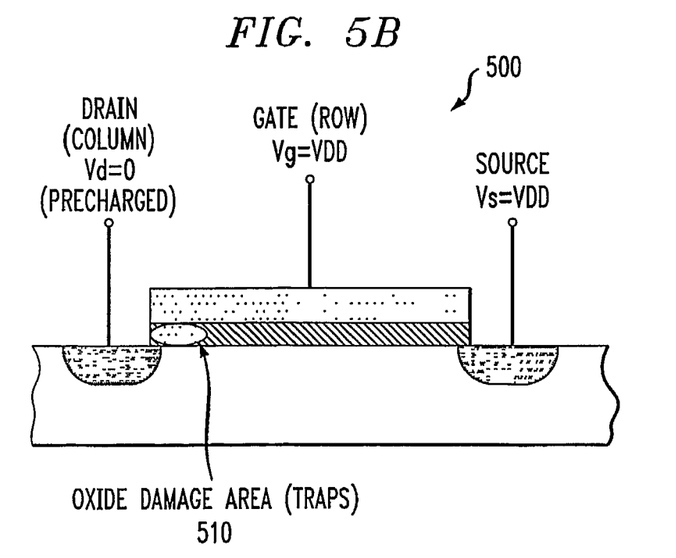

FIG. 5B is a schematic diagram illustrating the reading of the OTP memory cell 500 of FIG. 5A. When reading the OTP memory cell 500, the lower saturation current and threshold voltage is most apparent when the transistors current flow is in the opposite direction to current flow during programming. If the drain is defined for purposes of illustration as the terminal that is positive during program operations (FIG. 5A), then the source is the positive terminal during read operations (FIG. 5B). During read operations, the higher threshold channel region is near the grounded drain, so that its higher threshold is not hidden by the positively biased source junction's space charge region.

During a read operation, different sensing techniques and circuits would be used to differentiate programmed cells from non-programmed cells depending upon which transistor characteristic is used. If a cell has been programmed by inducing a change in the cell threshold voltage, such as in the OTP memory cell 500 of FIGS. 5A and 5B, then the cell 500 is read by (i) raising the source terminal for all cells to a positive potential ($V_{DD}$); and (ii) raising the gate connection for all cells along the selected row to a positive potential ($V_{DD}$). The column (drain) voltage would then change from its precharged voltage level (ground) to a cell transistor threshold voltage (Vt) below the source potential ($V_{DD}$). The programmed cells would have a higher Vt than the non-programmed cells that would be detected by the sense amplifier connected to the column.

Figure 6A:
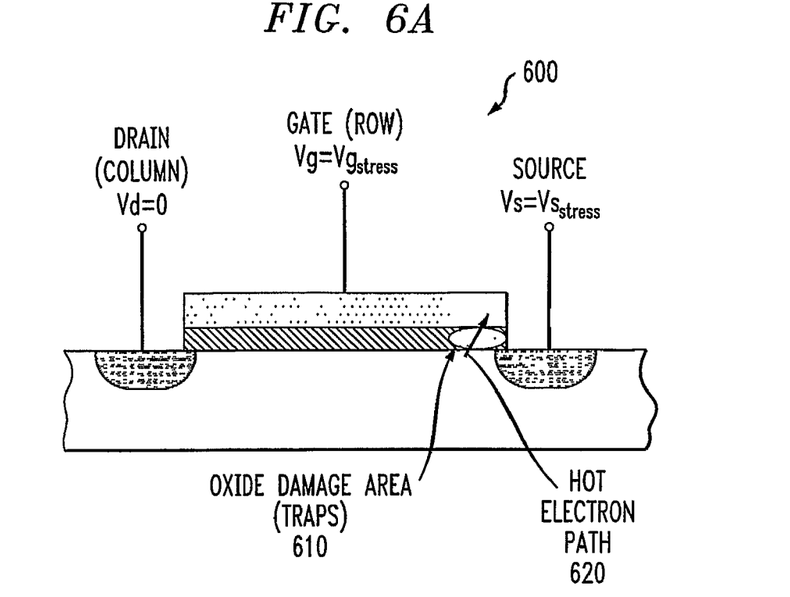
FIGS. 6A and 6B are schematic diagrams illustrating the programming and reading, respectively, of a second embodiment of an OTP memory cell incorporating features of the present invention.
Figure 6B:
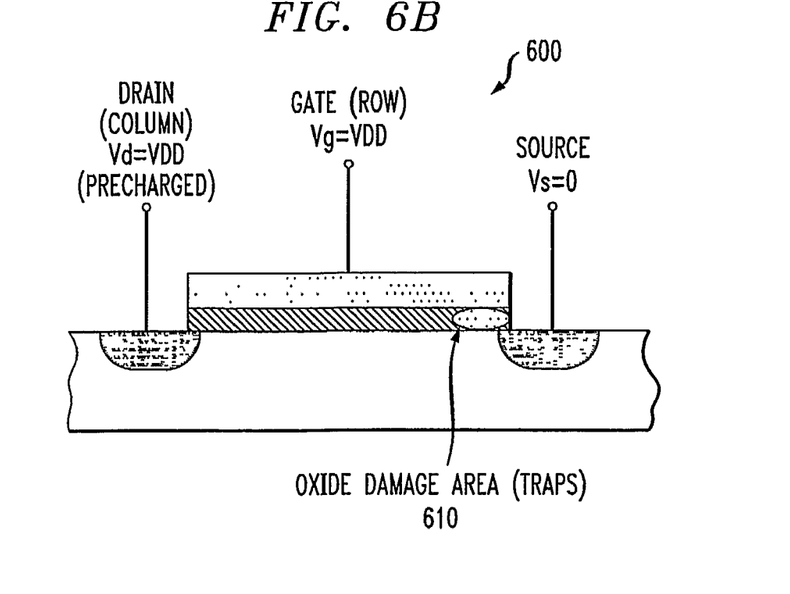

FIG. 6A is a schematic diagram illustrating the programming of a second embodiment of an OTP memory cell 600 incorporating features of the present invention. As shown in FIG. 6A, an OTP memory cell 600 is programmed during fabrication using hot carrier induced changes to the saturation current by applying "stressful" voltage levels to the source ($Vs_{stress}$) and gate ($Vg_{stress}$). The hot carrier degradation of the transistor characteristics creates an oxide damage area 610 (traps) near the source that degrades the channel mobility, causing a decrease in device saturation current FIG. 6B is a schematic diagram illustrating the reading of the OTP memory cell 600 of FIG. 6A. If a cell has been programmed by inducing a change in the cell saturation current, such as in the OTP memory cell 400 of FIGS. 6A and 6B, then the cell source terminal would remain at ground. The selected row (gate terminal) would be raised to a positive potential ($V_{DD}$) and current would be drawn from the pre-charged high ($V_{DD}$) column. The column voltage would decay towards ground. The rate of decay would depend upon column capacitance and cell saturation current. Thus, the columns associated with active programmed cells would decay at a slower rate than those associated with non-programmed cells. Sense amplifiers connected to the columns would differentiate between the programmed and non-programmed column voltage decay rates.

In further variations of the present invention, hot carrier programmable transistor cells can be enhanced by tailoring their structure to have more pronounced changes in saturation current and/or threshold voltage, or to have these changes occur at lower programming voltages or during shorter applications of programming voltages. Optimum transistor design for hot carrier effects is well known in the art (e.g., sharp drain junction profiles and non lightly doped drains (LDD)). The junction that receives the stress voltage during programming could be tailored for more pronounced changes in saturation current and/or threshold voltage. The other junction could remain as a common logic transistor junction that is designed to be relatively immune from hot carrier induced changes.

It is to be understood that the embodiments and variations shown and described herein are merely illustrative of the principles of this invention and that various modifications may be implemented by those skilled in the art without departing from the scope and spirit of the invention. For example, the OTP memory cells of the present invention can also be used as non-arrayed storage elements for applications requiring only a few OTP bits. The OTP memory cells of the present invention can also be implemented as multi-level flash or non-volatile cells that store two or more bits per cell. The OTP memory cells of the present invention provide low-cost alternative OTP element that can be used for high and low density applications, such as repair of Static Random Access Memories (SRAMs) and Dynamic Random Access Memories (DRAMs), identification and characterization coding of wafers and chips, analog circuit trimming, electronic fuses, field programmable logic devices, and encryption coded macros or systems.

We claim

1. A method for programming a one time programmable memory, comprising the steps of:
obtaining an array of transistors;
programming at least one of said transistors using a hot carrier transistor aging technique to alter a characteristic of said at least one of said transistor, wherein the hot carrier aging technique comprises injection of carriers into a gate oxide, wherein the injection of carriers causes at least one of the creation of traps and the filling of traps, and wherein said altered characteristic is a change in a threshold voltage of said at least one of said transistors; and
detecting said programmed at least one of said transistors by sensing said change in said threshold voltage of said at least one of said transistors;
wherein said detecting step comprises the steps of (i) a source terminal for each of said array of transistors to a positive potential, (ii) raising a gate terminal for all transistors along a selected row to a positive potential and (iii) detecting whether a drain voltage changes from a precharge voltage level to approximately a cell transistor threshold voltage below said positive gate terminal potential.

2. The method of claim 1, wherein said programming step further comprises the step of applying a stressful voltage to said at least one of said transistors to cause said hot carrier transistor aging.

3. The method of claim 1, wherein said programming step further comprises the step of applying a stressful voltage to a drain and a gate of said at least one of said transistors to cause said change in said threshold voltage of said of said at least one of said transistors.

4. The method of claim 1, wherein the step of programming causes a change in a saturation current of said at least one of said transistors.

5. The method of claim 4, wherein said programming step further comprises the step of applying a stressful voltage to a source and a gate of said at least one of said transistors to cause said change in said saturation current of said of said at least one of said transistors.

6. The method of claim 4, further comprising the step of detecting said programmed at least one of said transistors by sensing said change in said saturation current of said at least one of said transistors.

7. The method of claim 4, wherein said detecting step further comprises the steps of raising a voltage on at least one column in said array of transistors to a positive potential; raising a gate terminal of each transistor in a selected row to a positive potential and evaluating a rate of voltage decay of at least one column in said array of transistors.

8. A one time programmable memory, comprising:
an array of transistors, wherein at least one of said transistors is programmed using hot carrier transistor aging to alter a characteristic of said at least one of said transistor, wherein the hot carrier aging comprises injection of carriers into a gate oxide, wherein the injection of carriers causes at least one of the creation of traps and the filling of traps, and wherein said altered characteristic is a change in a threshold voltage of said at least one of said transistors; and
a circuit for sensing said altered characteristic of said at least one of said transistor, wherein said circuit senses said change in said threshold voltage of said at least one of said transistors, and wherein said circuit (i) raises a source terminal for each of said array of transistors to a positive potential, (ii) raises a gate terminal for all transistors along a selected row to a positive potential and (iii) detects whether a drain voltage changes from a precharge voltage level to approximately a cell transistor threshold voltage below said positive gate potential.

9. The one time programmable memory of claim 8, wherein said at least one of said transistors is programmed by applying a stressful voltage to said at least one of said transistors to cause said hot carrier transistor aging.

10. The one time programmable memory of claim 8, wherein said at least one of said transistors is programmed by applying a stressful voltage to a drain and a gate of said at least one of said transistors to cause said change in said threshold voltage of said of said at least one of said transistors.

11. The one time programmable memory of claim 8, wherein the programming of said at least one of said transistors causes a change in a saturation current of said at least one of said transistors.

12. The one time programmable memory of claim 11, wherein said at least one of said transistors is programmed by applying a stressful voltage to a source and a gate of said at least one of said transistors to cause said change in said saturation current of said of said at least one of said transistors.

13. The one time programmable memory of claim 11, wherein said circuit senses said change in said saturation current of said at least one of said transistors.

14. The one time programmable memory of claim 11, wherein said circuit raises a voltage on at least one column in said array of transistors to a positive potential; raises a gate terminal of each transistor in a selected row to a positive potential and evaluates a rate of voltage decay of at least one column in said array of transistors.

15. A one time programmable memory element, comprising
at least one transistor that is programmed using hot carrier transistor aging to alter a transistor characteristic, wherein the hot carrier aging comprises injection of carriers into a gate oxide, wherein the injection of carriers causes at least one of the creation of traps and the filling of traps, and wherein said altered transistor characteristic is a change in a threshold voltage of said at least one transistor; and a circuit for sensing said altered characteristic of said at least one transistor, wherein said circuit senses said change in said threshold voltage, and wherein said circuit (i) raises a source terminal for said at least one transistor to a positive potential, (ii) raises a gate terminal for said at least one transistor to a positive potential and (iii) detects whether a drain voltage changes from a precharge voltage level to approximately a cell transistor threshold voltage below said positive gate potential.

16. The one time programmable memory element of claim 15, wherein the programming of said at least one transistor causes a change in a saturation current of said transistor.

17. An integrated circuit, comprising:
a one time programmable memory, comprising
an array of transistors, wherein at least one of said transistors is programmed using hot carrier transistor aging to alter a characteristic of said at least one of said transistor, wherein the hot carrier aging comprises injection of carriers into a gate oxide, wherein the injection of carriers causes at least one of the creation of traps and the filling of traps, and wherein said altered characteristic is a change in a threshold voltage of said at least one of said transistors; and a circuit for sensing said altered characteristic of said at least one of said transistor, wherein said circuit senses said change in said threshold voltage of said at least one of said transistors, and wherein said circuit (i) raises a source terminal for each of said array of transistors to a positive potential, (ii) raises a gate terminal for all transistors along a selected row to a positive potential and (iii) detects whether a drain voltage changes from a precharge voltage level to approximately a cell transistor threshold voltage below said positive gate potential.

18. The integrated circuit of claim 17, wherein said at least one of said transistors is programmed by applying a stressful voltage to said at least one of said transistors to cause said hot carrier transistor aging.

19. The integrated circuit of claim 17, wherein the programming of said at least one transistor causes a change in a saturation current of said at least one of said transistors.

* * * * *

UNITED STATES PATENT AND TRADEMARK OFFICE
CERTIFICATE OF CORRECTION

| | | |
|---|---|---|
| PATENT NO. | : 7,764,541 B2 | Page 1 of 1 |
| APPLICATION NO. | : 10/586176 | |
| DATED | : July 27, 2010 | |
| INVENTOR(S) | : Ross Alan Kohler et al. | |

It is certified that error appears in the above-identified patent and that said Letters Patent is hereby corrected as shown below:

In claim 1, column 5, line 46-47, "(i) a source" should be replaced by -- (i) raising a source --

Signed and Sealed this
Seventeenth Day of July, 2012

David J. Kappos
*Director of the United States Patent and Trademark Office*